(12) United States Patent
Nagawa

(10) Patent No.: US 7,433,378 B2
(45) Date of Patent: Oct. 7, 2008

(54) OPTICAL ELEMENT AND METHOD FOR MANUFACTURING THE SAME

(75) Inventor: Michifumi Nagawa, Fujimi (JP)

(73) Assignee: Seiko Epson Corporation (JP)

( * ) Notice: Subject to any disclaimer, the term of this patent is extended or adjusted under 35 U.S.C. 154(b) by 0 days.

(21) Appl. No.: 11/537,092

(22) Filed: Sep. 29, 2006

(65) Prior Publication Data
US 2007/0091963 A1    Apr. 26, 2007

(30) Foreign Application Priority Data
Oct. 26, 2005  (JP) ............................. 2005-311200
Jun. 16, 2006  (JP) ............................. 2006-167231

(51) Int. Cl.
*H01S 3/00*    (2006.01)
*H01S 5/00*    (2006.01)

(52) U.S. Cl. ............... 372/50.1; 372/38.09; 372/50.124

(58) Field of Classification Search ............ 372/50.124, 372/50.1, 38.1, 38.02, 38.07, 38.09, 43.01
See application file for complete search history.

(56) References Cited

U.S. PATENT DOCUMENTS 6,185,240 B1 * 2/2001 Jiang et al. ............. 372/50.124

2005/0238076 A1 * 10/2005 Kuwata et al. ............. 372/50.1
2006/0002440 A1    1/2006 Nagawa
2007/0096119 A1 *  5/2007 Sato ............................. 257/81

FOREIGN PATENT DOCUMENTS

JP    2006-019498    1/2006

* cited by examiner

*Primary Examiner*—Armando Rodriguez
(74) *Attorney, Agent, or Firm*—Harness, Dickey & Pierce, P.L.C.

(57) ABSTRACT

An optical element includes: a substrate; a surface-emitting type semiconductor laser that is provided on the substrate and emits laser light in a direction orthogonal to a surface of the substrate; a rectification element that is provided on the substrate and connected in parallel with the surface-emitting type semiconductor laser, the rectification element having a rectification action with respect to a reverse bias voltage applied to the surface-emitting type semiconductor laser; a first insulation layer that covers a side surface and a portion of an upper surface of a first columnar section including at least a portion of the surface-emitting type semiconductor laser; and a second insulation layer that covers a side surface and an upper surface of a second columnar section along an entire circumference thereof, the second columnar section including at least a portion of the rectification element.

7 Claims, 9 Drawing Sheets

OPTICAL ELEMENT AND METHOD FOR MANUFACTURING THE SAME

The entire disclosure of Japanese Patent Application No. 2005-311200, filed Oct. 26, 2005 and No. 2006-167231, filed Jun. 16, 2006 are expressly incorporated by reference herein.

BACKGROUND

1. Technical Field

The present invention relates to optical elements that emit laser light and methods for manufacturing the same.

2. Related Art

A surface-emitting type semiconductor laser is one type of optical elements that emit laser light. The surface-emitting type semiconductor laser is provided with a resonator formed in a direction orthogonal to a surface of the substrate, and emits laser light from an upper surface of the resonator. A surface-emitting type semiconductor laser has a smaller device volume compared to an ordinary edge-emitting type semiconductor laser, such that the electrostatic breakdown voltage of the device itself is low, and in particular, the device has a low dielectric breakdown withstanding property against reverse bias voltages. For this reason, the device may be destroyed by static electricity caused by a machine or an operator during a mounting process. To solve this problem, for example, U.S. Pat. No. 6,185,240 describes a technology in which a surface-emitting type semiconductor laser and a rectification diode that circulates a current only when a reverse bias voltage is applied to the surface-emitting type semiconductor laser are connected in parallel with each other and formed on a substrate.

FIG. 16A is a schematic cross-sectional view of an exemplary structure of an optical element formed from a surface-emitting type semiconductor laser and a rectification diode. As shown in the figure, a first n-type semiconductor layer 31 (a distributed reflection type multilayer mirror composed of n-type semiconductor) is formed on a substrate 30, and an i-type semiconductor layer 32 and a first electrode 33 are formed on the first n-type semiconductor layer 31. Columnar first p-type semiconductor layer 34 and second p-type semiconductor layer 35 (distributed reflection type multilayer mirrors composed of p-type semiconductor) are formed, separated from each other, on the i-type semiconductor layer 32, and an insulation layer 36 is formed in a manner to cover side surfaces of the first p-type semiconductor layer 34 and the second p-type semiconductor layer 35. A second n-type semiconductor layer 37 and a second electrode 38 are formed on the second p-type semiconductor layer 35. A third electrode 39 defining an opening section 34a is formed on the first p-type semiconductor layer 34, the insulation layer 36 covering the side surface of the first p-type semiconductor layer 34, and the second n-type semiconductor layer 37, whereby the first p-type semiconductor layer 34 and the second n-type semiconductor layer 37 are conductively connected with each other. Further, a fourth electrode 40 is formed to conductively connect the first electrode 33 and the second electrode 38 with each other.

The first n-type semiconductor layer 31, the i-type semiconductor layer 32 and the first p-type semiconductor layer 34 compose a surface-emitting type semiconductor laser V, wherein laser light is emitted from the opening section 34a. Also, the second p-type semiconductor layer 35 and the second n-type semiconductor layer 37 compose a rectification diode E. In other words, the optical element has, as shown in FIG. 16B, the surface-emitting type semiconductor laser V and the rectification diode E connected in parallel with each other, wherein a current flows through the rectification diode E only when a reverse bias voltage is applied to the surface-emitting type semiconductor laser V.

Because the surface-emitting type semiconductor laser V and the rectification diode E are formed in columnar structures disposed separated from each other in the manner described above, side surfaces of the columnar sections are covered by the insulation layer 36 to suppress step differences where the electrodes are formed as much as possible. As a material of the insulation layer 36, a resin material such as polyimide and the like is generally used, but the coefficients of the resin material and the semiconductor material are greatly different from each other. More concretely, when heated, the insulation layer 36 contracts in a greater amount than the columnar sections that are composed of the semiconductor material. Accordingly, if a heating step is conducted in the process for manufacturing an optical element, or the temperature of the optical element that has been finished as a product rises during its use, the insulation layer 36 may be exfoliated from the columnar sections, and the electrodes may be disconnected at interfaces between the insulation layer 36 and the columnar sections. The disconnection of the electrodes that may occur with a temperature increase would cause a lowered yield in the manufacturing process, and a lowered reliability in the product.

SUMMARY

In accordance with an advantage of some aspects of the present invention, an optical element having a surface-emitting type semiconductor laser and a rectification diode can be prevented from lowering the yield and reliability due to disconnection of electrodes which may be caused by a temperature increase.

In accordance with an embodiment of the invention, an optical element is equipped, on a common substrate, with a surface-emitting type semiconductor laser that emits laser light in a direction orthogonal to a substrate surface, a rectification element that is connected in parallel with the surface-emitting type semiconductor laser and has a rectification action with respect to a reverse bias voltage applied to the surface-emitting type semiconductor laser, a first insulation layer that covers a side surface and a portion of an upper surface of a first columnar section including at least a portion of the surface-emitting type semiconductor laser, and a second insulation layer that covers a side surface and an upper surface along its entire circumference of a second columnar section including at least a portion of the rectification element.

In accordance with the embodiment described above, the side surface and a portion of the upper surface of the first columnar section that includes at least a portion of the surface-emitting type semiconductor laser are covered by the first insulation layer, and the side surface and the upper surface along its entire circumference of the second columnar section that includes at least a portion of the rectification element are covered by the second insulation layer. As a result, exfoliation of the first insulation layer from the first columnar section and exfoliation of the second insulation layer from the second columnar section which may be caused by temperature increases can be prevented, and disconnection of the electrodes provided on the insulation layers can be prevented. In other words, a reduction in the yield and reliability due to disconnection of the electrodes associated with a temperature increase can be prevented.

It is noted here that the second insulation layer covers the upper surface of the second columnar section along its entire circumference, such that, even when the second insulation layer expands or contracts in the manufacturing process or the like, loads caused by the expansion or the contraction of the second insulation layer are evenly applied to the second columnar section and the second insulation layer. For this reason, the adhesion strength between the second insulation layer and the second columnar section can be maintained. Therefore, when designing an optical element, it becomes unnecessary to consider if loads are uniformly applied to the second columnar section and the second insulation layer to prevent exfoliation of the second insulation layer which may be caused by a localized load applied to the second insulation layer at the time of expansion or contraction of the second insulation layer. Accordingly, destruction of surface-emitting type semiconductor lasers by static electricity can be suppressed, and the degree of freedom in designing optical elements is improved.

In the optical element in accordance with an aspect of the embodiment of the invention, the first insulation layer may preferably cover the upper surface of the first columnar section along the entire circumference thereof.

In the optical element in accordance with an aspect of the embodiment of the invention, a first electrode that is bonded with an upper surface of the first columnar section and electrically connected to the surface-emitting type semiconductor laser may preferably be formed on the first insulation layer, wherein the first insulation layer covers the upper surface of the first columnar section at least in a portion below the first electrode.

According to the present embodiment, the first insulation layer that is located below the first electrode that is bonded with the upper surface of the first columnar section and electrically connected to the surface-emitting type semiconductor laser covers at least the upper surface of the first columnar section, such that exfoliation of the first insulation layer from the first columnar section at least below the first electrode can be prevented and disconnection of the first electrode can be eliminated.

In the optical element in accordance with an aspect of the embodiment of the invention, the first insulation layer may preferably cover the upper surface of the first columnar section from its outer circumferential end section toward its center by at least 1 µm.

In the optical element in accordance with an aspect of the embodiment of the invention, a second electrode that is bonded with an upper surface of the second columnar section and electrically connected to the rectification element may preferably be formed on the second insulation layer, wherein the second insulation layer covers the upper surface of the second columnar section at least in a portion below the second electrode.

According to the present embodiment, the second insulation layer that is located below the second electrode that is bonded with the upper surface of the second columnar section and electrically connected to the rectification element covers at least the upper surface of the second columnar section, such that exfoliation of the second insulation layer from the second columnar section at least below the second electrode can be prevented and disconnection of the second electrode can be eliminated.

In the optical element in accordance with an aspect of the embodiment of the invention, the second insulation layer may preferably cover the upper surface of the second columnar section from its outer circumferential end section toward its center by at least 1 µm.

In accordance with another embodiment of the invention, there is provided a method for manufacturing an optical element having, on a common substrate, a surface-emitting type semiconductor laser that emits laser light in a direction orthogonal to a substrate surface and a rectification element that is connected in parallel with the surface-emitting type semiconductor laser and has a rectification action against a reverse bias voltage applied to the surface-emitting type semiconductor laser, the method including the steps of: forming a plurality of semiconductor layers for composing the surface-emitting type semiconductor laser and the rectification element; forming a first columnar section including at least a portion of the surface-emitting type semiconductor laser by etching the semiconductor layers; forming a second columnar section including at least a portion of the rectification element by etching the semiconductor layers; forming a first insulation layer that covers a side surface and a portion of an upper surface of the first columnar section; and forming a second insulation layer that covers a side surface and an upper surface of the second columnar section along an entire circumference thereof.

In accordance with the present embodiment, the first insulation layer is formed in a manner to cover the side surface and a portion of the upper surface of the first columnar section that includes at least a portion of the surface-emitting type semiconductor laser, and the second insulation layer is formed in a manner to cover the side surface and the entire circumference of the upper surface of the second columnar section that includes at least a portion of the rectification element. As a result, exfoliation of the first insulation layer from the first columnar section and exfoliation of the second insulation layer from the second columnar section which may be caused by temperature increases can be prevented, and disconnection of electrodes provided on the insulation layers can be prevented. In other words, reduction in the yield and reliability due to disconnection of the electrodes associated with temperature increases can be prevented.

It is noted that, as the rectification element is composed of extremely thin semiconductor layers, an electrode provided on an upper surface of the rectification element is placed close to the side surface (in other words, the semiconductor layers) of the rectification element, and a leakage current may be generated. However, according to the present embodiment, the side surface and the upper surface along its entire circumferential of the second columnar section that includes at least a portion of the rectification element are covered by the second insulation layer, an electrode can be formed at a position removed from the semiconductor layers, and generation of a leakage current can be prevented.

It is noted here that the second insulation layer covers the upper surface along its entire circumference of the second columnar section, such that, even when the second insulation layer expands or contracts in the manufacturing process or the like, loads caused by the expansion or the contraction of the second insulation layer are evenly applied to the second columnar section and the second insulation layer. For this reason, the adhesion strength between the second insulation layer and the second columnar section can be maintained. Therefore, when designing an optical element, it becomes unnecessary to consider if loads are uniformly applied to the second columnar section and the second insulation layer to prevent exfoliation of the second insulation layer which may be caused by a load locally applied to the second insulation layer at the time of expansion or contraction of the second insulation layer. Accordingly, destruction of surface-emitting type semiconductor lasers by static electricity can be suppressed, and the degree of freedom in designing optical elements is improved.

DESCRIPTION OF EXEMPLARY EMBODIMENTS

Figure 1:
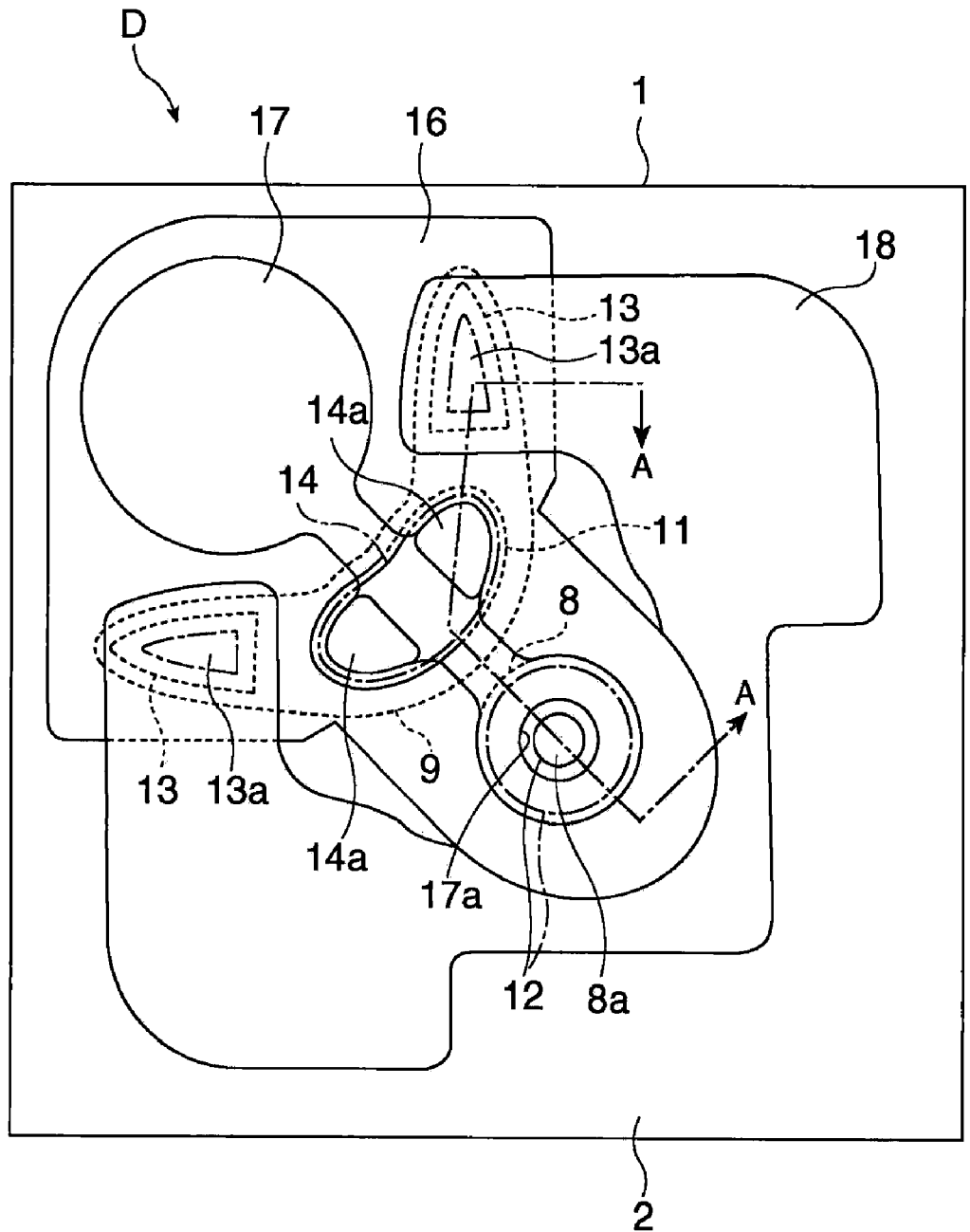
FIG. 1 is a plan view of an optical element in accordance with a first embodiment of the invention.

Embodiments of the invention are described below with reference to the accompanying drawings. It is noted that the embodiments pertain to an optical element composed of a surface-emitting type semiconductor laser and a rectification diode provided as a protective measure against static electricity. It is noted that the embodiment to be described below indicates a part of modes of the invention, does not limit the invention, and can be appropriately modified within the scope of the invention. Also, in the drawings referred to below for describing the invention, the scale may be changed for each of the layers and each of the members such that the layers and the members have appropriate sizes that can be recognized on the drawings.

Structure of Optical Element

Figure 2:
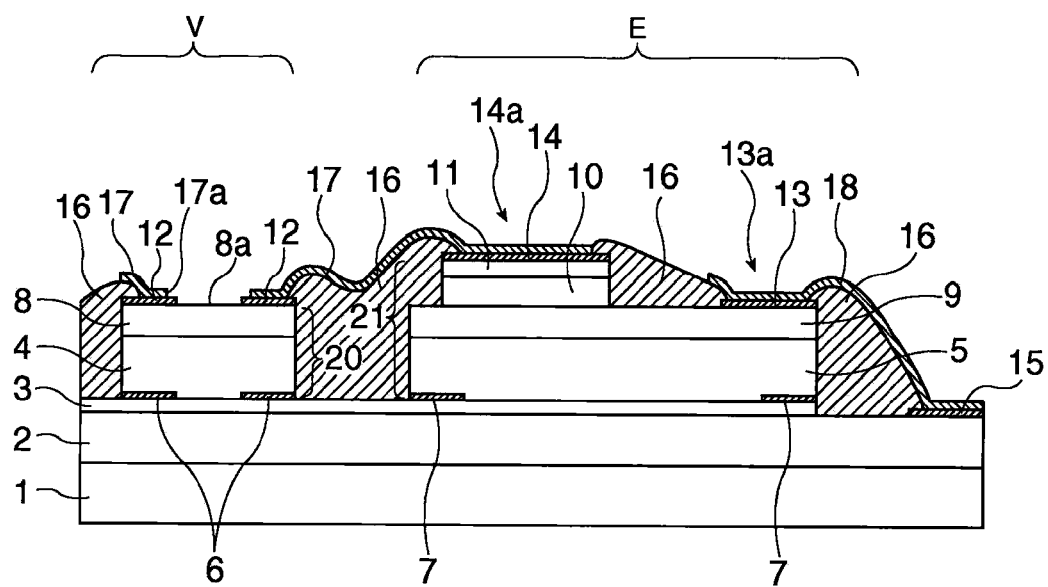
FIG. 2 is a cross-sectional view of the optical element shown in FIG. 1.

First, the structure of an optical element in accordance with an embodiment of the invention is described with reference to FIGS. 1 and 2. FIG. 1 is a schematic plan view of an optical element D in accordance with the embodiment of the invention, and FIG. 2 is a schematic cross-sectional view of the optical element in accordance with the embodiment of the invention. It is noted that FIG. 2 is a cross-sectional view taken along a line A-A in FIG. 1. As shown in FIG. 2, the optical element D of the present embodiment has a structure including a surface-emitting type semiconductor laser V and a rectification diode E.

The surface-emitting type semiconductor laser V and the rectification diode E are formed on a substrate 1, for example, a semiconductor substrate composed of n-type GaAs. For example, on the substrate 1 is formed, for example, a distributed reflection type multilayer mirror of 40 pairs of alternately laminated n-type $Al_{0.9}Ga_{0.1}As$ layers and n-type $Al_{0.15}Ga_{0.85}As$ layers (hereafter called a "first mirror") 2, an active layer 3 composed of GaAs well layers and $Al_{0.3}Ga_{0.7}As$ barrier layers in which the well layers include a quantum well structure composed of three layers, and a first electrode 15.

A distributed reflection type multilayer mirror of 25 pairs of alternately laminated p-type $Al_{0.9}Ga_{0.1}As$ layers and p-type $Al_{0.15}Ga_{0.85}As$ layers (hereafter called a "second mirror") 4, and a second mirror layer 5 separated from the second mirror layer 4 and composed of the same material as that of the second mirror 4 are formed on the active layer 3. Also, current constricting layers 6 and 7, obtained by oxidizing the AlGaAs layer from its side surface, are formed in a region near the active layer 3 among the layers composing the second mirror 4 and 5, respectively. Moreover, a contact layer 8 composed of p-type GaAs is formed on the second mirror layer 4, and a contact layer 9 composed of p-type GaAs is formed on the second mirror layer 5.

The contact layer 8 and the second mirror layer 4 have a circular columnar configuration (hereafter referred to as a first columnar section 20), and a second electrode 12 in a ring shape concentric with the first columnar section 20 is formed on the contact layer 8. A central section of the second electrode 12 defines an opening section 8a defining a laser light emission surface. In other words, the first mirror layer 2, the active layer 3, the second mirror layer 4, and the contact layer 8 form the surface-emitting type semiconductor laser V. The first mirror layer 2 composing the surface-emitting type semiconductor laser V is made to be n-type by doping, for example, silicon (Si), and the second mirror layer 4 and the contact layer 8 are made to be p-type by doping, for example, carbon (C). Accordingly, the p-type contact layer 8 and second mirror layer 4, the active layer 3 in which no impurity is doped, and the n-type first mirror layer 2 for a pin diode.

An i-type semiconductor layer 10 composed of intrinsic semiconductor and a third electrode 13 are formed on the contact layer 9. An n-type semiconductor layer 11 composed of n-type GaAs is formed on the i-type semiconductor layer 10, and a fourth electrode 14 is formed on the n-type semiconductor layer 11. The contact layer 9 and the second mirror layer 5 have a plane configuration in a generally symmetrical L-letter shape shown in FIG. 1, and the n-type semiconductor layer 11 and the i-type semiconductor layer 10 formed on an upper surface of these layers 9 and 5 have a generally oval plane configuration. The n-type semiconductor layer 11, the i-type semiconductor layer 10, the contact layer 9 and the second mirror layer 5 form a second columnar section 21, and of these layers, the contact layer 9, the i-type semiconductor layer 10 and the n-type semiconductor layer 11 form a pin diode, in other words, the rectification diode E.

Furthermore, an insulation layer (first insulation layer, second insulation layer) 16 composed of, for example, polyimide resin is formed on the active layer 3, the first mirror layer 2 and the contact layer 9 in a manner to surround the circumferences of the first columnar section 20 and the second columnar section 21.

On the insulation layer 16, a fifth electrode 17 that conductively connects the second electrode 12 and the fourth electrode 14, and a sixth electrode 18 that conductively connects the third electrode 13 and the first electrode 15 are formed. It is noted that, in FIG. 1 and FIG. 2, a reference numeral 14a denotes a contact section between the fourth electrode 14 and the fifth electrode 17, and a reference numeral 13a denotes a contact section between the third electrode 13 and the sixth electrode 18. Accordingly, the surface-emitting type semiconductor laser V and the rectification diode E are connected in parallel with each other, and structured such that, only when a reverse bias voltage caused by static electricity is applied to the surface-emitting type semiconductor laser V, a current flows through the rectification diode E.

As described above, by forming the insulation layer 16 that covers a marginal portion of each of the electrodes, contraction of the polyimide resin that may be caused by temperature increase can be suppressed, and as a result, disconnection of the electrodes formed on the insulation layer 16 can be prevented. In other words, the yield in the manufacturing process can be prevented from being lowered, and the product reliability can be prevented from being reduced.

More concretely, the insulation layer 16 may preferably cover the upper surface of each of the electrodes from its outer circumferential end section toward its center by at least 1 μm or more. However, to what extent the upper surface of the second electrode 12 is to be covered by the insulation layer 16 may be decided in consideration of the area of the opening section 8a, a contact area between the second electrode 12 and the fifth electrode 17, and the like. Also, to what extent the upper surface of the fourth electrode 14 is to be covered by the insulation layer 16 may be decided in consideration of a contact area between the fourth electrode 14 and the fifth electrode 17. To what extent the upper surface of the third electrode 13 is to be covered by the insulation layer 16 may be decided in consideration of a contact area between the third electrode 13 and the sixth electrode 18. To what extent the upper surface of the first electrode 15 is to be covered by the insulation layer 16 may be decided in consideration of a contact area between the first electrode 15 and the sixth electrode 18.

In prior art, because there is no need to conductively connect the third electrode 13 and the fourth electrode 14 on the side of the rectification diode E, the insulation layer 16 on the contact layer 9 is not provided. In this case, however, there is a possibility that a leakage current may be generated between the fourth electrode 14 and the contact layer 9 as the n-type semiconductor layer 11 and the i-type semiconductor layer 10 are very thin. However, in accordance with the present embodiment, the insulation layer 16 is formed in a manner to surround the circumferences of the n-type semiconductor layer 11 and the i-type semiconductor layer 10, such that generation of the leakage current described above can be prevented. Furthermore, because the insulation layer 16 covers the upper surface of the second columnar section 21 along the entire circumference thereof, loads that may be generated when the insulation layer 16 contracts are uniformly applied to the second columnar section 21, and therefore the adhesion between the insulation layer 16 and the second columnar section 21 is maintained. Therefore electrostatic destruction of the surface-emitting type semiconductor laser V can be suppressed. Accordingly, there is no need to design the optical element D in such a way that loads are uniformly applied to the second columnar section 21 and the insulation layer 16 at the time of contraction of the insulation layer 16, and the degree of freedom in designing the optical element D is improved.

It is noted that, in accordance with the present embodiment, the plane configuration of the first columnar section 20 (i.e., the surface-emitting type semiconductor laser V) is in a circular shape, and the plane configuration of the second columnar section 21 (i.e., the rectification diode E) is in a generally L-letter shape. However, these configurations can be in any other arbitrary shapes.

Operation of Optical Element

General operations of the optical element D of the present embodiment are described below. It is noted that the following method for driving the optical element D is described as an example, and various changes can be made within the scope of the invention. First, when a voltage in a forward direction is applied to the pin diode composed of the second mirror layer 4, the active layer 3 and the first mirror layer 2 across the fifth electrode 17 and the first electrode 15 that are connected to a power supply (not shown), recombination of electrons and holes occur in the active layer 3 of the surface-emitting type semiconductor laser V, thereby causing emission of light due to the recombination. Stimulated emission occurs during the period the generated light reciprocates between the second mirror 4 and the first mirror 2, whereby the light intensity is amplified. When the optical gain exceeds the optical loss, laser oscillation occurs, whereby laser light is emitted from the opening section 8a.

When a voltage in a forward direction is applied to the pin diode on the side of the surface-emitting type semiconductor laser V, a reverse bias voltage is applied to the pin diode (the rectification diode E) composed of the contact layer 9, the i-type semiconductor layer 10 and the n-type semiconductor layer 11, and therefore no current flows through the rectification diode E. However, when a reverse bias voltage caused by static electricity is applied to the pin diode on the side of the surface-emitting type semiconductor laser V, in other words, when a voltage in a forward direction is applied to the rectification diode E, a current circulates through the rectification diode E, such that destruction of the surface-emitting type semiconductor laser V by static electricity can be prevented.

Method for Manufacturing Optical Element

Next, a method for manufacturing the optical element D described above is described. FIGS. 3-11 are cross-sectional views schematically showing a process of manufacturing the optical element D in accordance with an embodiment of the invention. It is noted that these drawings correspond to the cross-sectional view shown in FIG. 2, respectively.

Figure 3:
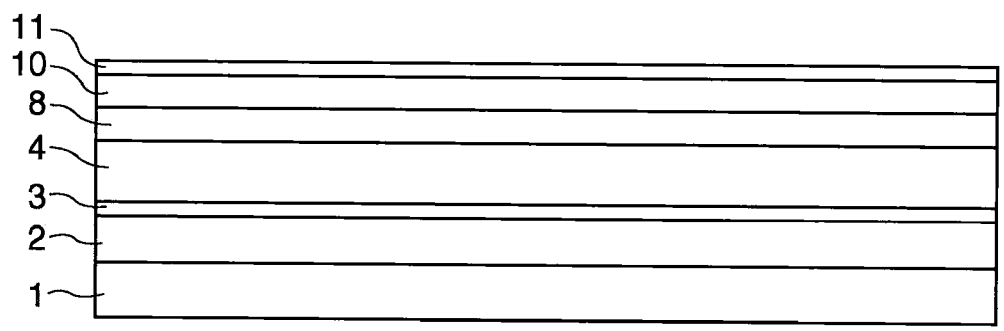
FIG. 3 is a first view for describing a method for manufacturing the optical element shown in FIG. 1.

First, as shown in FIG. 3, on a semiconductor substrate 1 composed of an n-type GaAs layer, a first mirror layer 2, an active layer 3, a second mirror layer 4, a contact layer 8, an i-type semiconductor layer 10 and an n-type semiconductor layer 11 are formed by epitaxial growth while modifying their composition. It is noted that, when the second mirror 4 is grown, at least one layer thereof near the active layer 3 is formed to be an AlAs layer or an AlGaAs layer with an Al composition being 0.95 or greater. This layer is later oxidized and functions as current constricting layers 6 and 7. Furthermore, by providing the contact layer 8, a second electrode 12 and a third electrode 13 can readily form an ohmic contact.

The first mirror layer 2 is composed of a distributed reflection type multilayer mirror, for example, composed of 40 pairs of alternately laminated n-type $Al_{0.9}Ga_{0.1}As$ layers and n-type $Al_{0.15}Ga_{0.85}As$ layers. The active layer 3 is composed of $Al_{0.3}Ga_{0.7}As$ barrier layers including a quantum well structure composed of three layers of GaAs well layers. The second mirror 4 is composed of a distributed reflection type multilayer mirror, for example, composed of 25 pairs of alternately laminated p-type $Al_{0.9}Ga_{0.1}As$ layers and p-type $Al_{0.15}Ga_{0.85}As$ layers.

The temperature at which the epitaxial growth is conducted is appropriately decided depending on the growth method, the kind of raw material, the type of the substrate 1, and the kind, thickness and carrier density of the semiconductor layer to be formed, and may preferably be set generally at 450° C.-800° C. Also, the time required for conducting the epitaxial growth is appropriately decided like the temperature. Also, a metal-organic vapor phase deposition method, a MBE method (Molecular Beam Epitaxy) method, a LPE (Liquid Phase Epitaxy) method or the like can be used as a method for the epitaxial growth.

Figure 4:
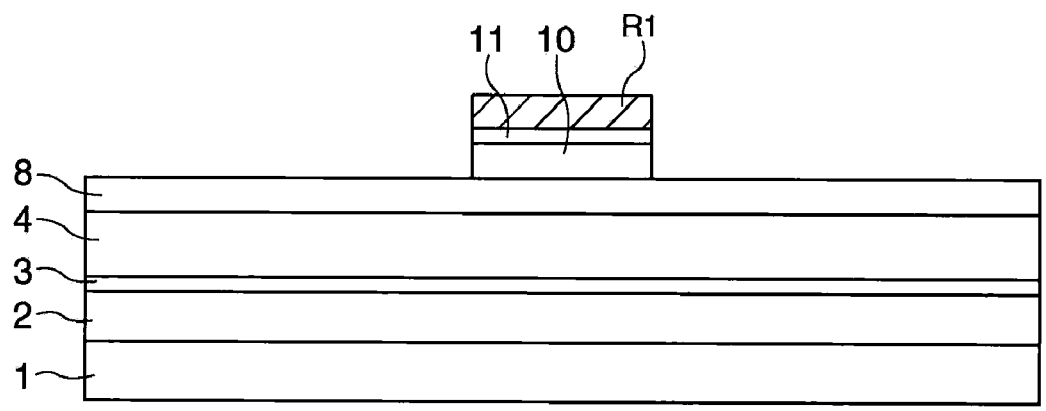
FIG. 4 is a second view for describing the method for manufacturing the optical element.

Next, the i-type semiconductor layer 10 and the n-type semiconductor layer 11 are patterned. Concretely, as shown in FIG. 4, resist is coated on the n-type semiconductor layer 11, and the resist is patterned to form a resist layer R1 having a predetermined pattern. Then, by using the resist layer R1 as a mask, etching (for example, dry etching or wet etching) is conducted to form the i-type semiconductor layer 10 and the n-type semiconductor layer 11 having a predetermined pattern.

Figure 5:
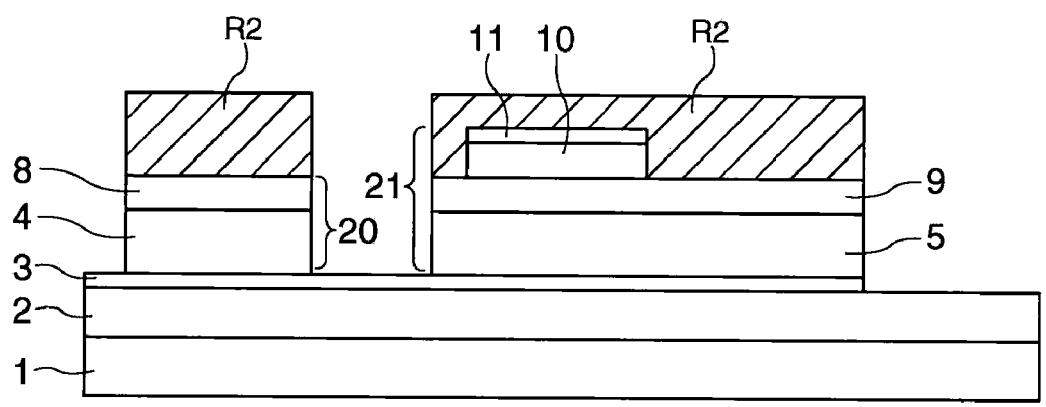
FIG. 5 is a third view for describing the method for manufacturing the optical element.
Figure 6:
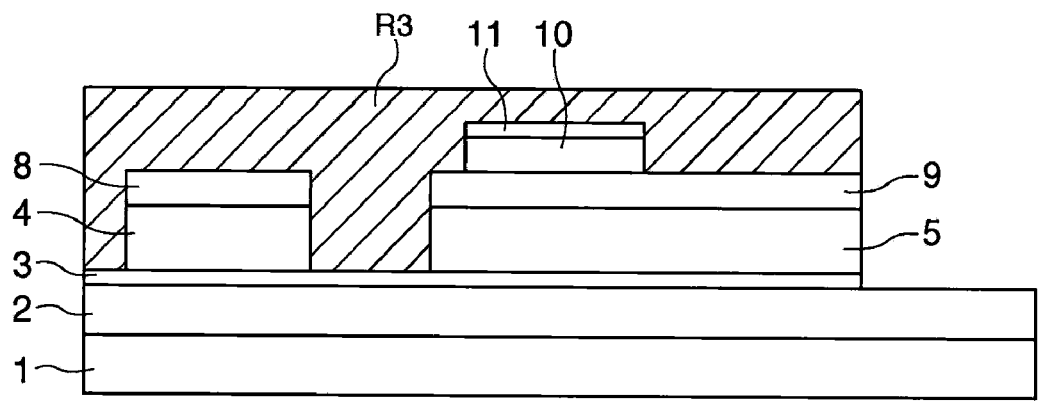
FIG. 6 is a fourth view for describing the method for manufacturing the optical element.

Then, the second mirror layer 4 and the contact layer 8 are patterned. Concretely, as shown in FIG. 5, a resist layer R2 having a predetermined pattern is formed in a manner similar to the above, and then etching is conducted by using the resist layer R2 as a mask, whereby the second mirror layer 4 and the contact layer 8 of a first columnar section 20 (i.e., a surface-emitting type semiconductor laser V) are formed, and a second mirror layer 5 and the contact layer 9 of a second columnar section 21 (i.e., a rectification diode E) are formed. Furthermore, as shown in FIG. 6, the active layer R3 is etched by using the resist layer R3 as a mask, thereby exposing a portion of the surface of the first mirror layer 2. It is noted that the order of the patterning steps is not limited to the order described above.

Figure 7:
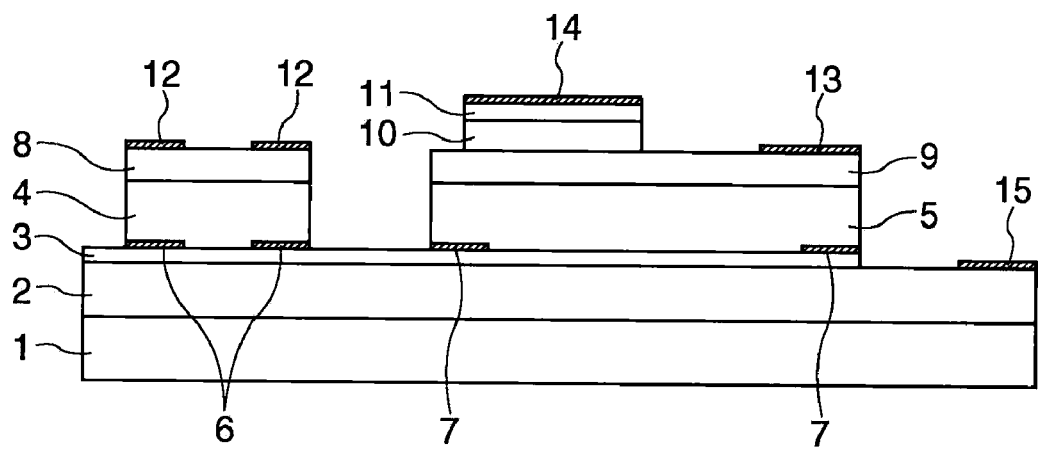
FIG. 7 is a fifth view for describing the method for manufacturing the optical element.

Then, as shown in FIG. 7, the substrate 1 on which the layers are formed is placed in a water vapor atmosphere at, for example, about 400° C., whereby at least one layer near the active layer 3 among each of the second mirror layers 4 and 5 described above, which have been formed to be an AlAs layer or an AlGaAs layer with an Al composition being 0.95 or greater, is oxidized from their side surfaces, thereby forming current constricting layers 6 and 7. Furthermore, a first electrode 15, a second electrode 12, a third electrode 13 and a fourth electrode 14 each having a predetermined pattern are formed by a photolithography method.

Figure 8:
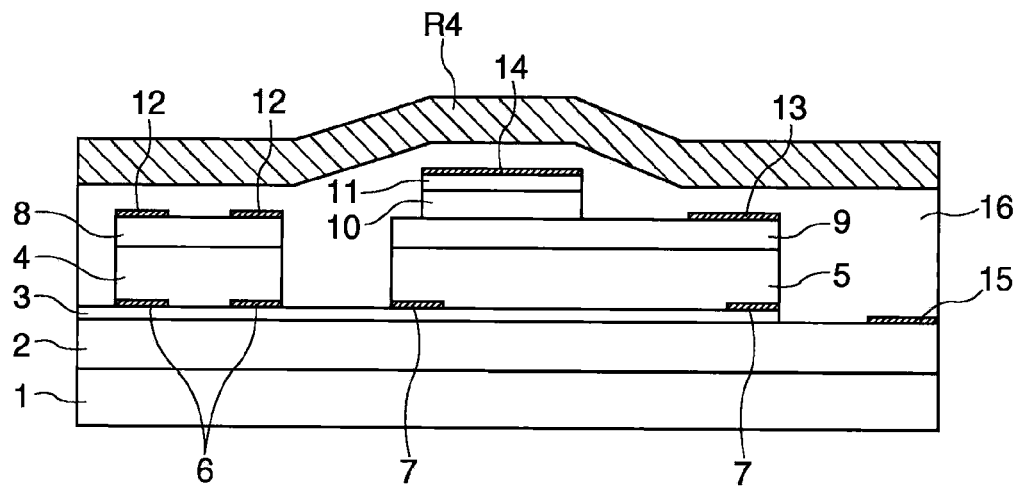
FIG. 8 is a sixth view for describing the method for manufacturing the optical element.

Next, an insulation layer 16 composed of polyimide resin is formed. Concretely, first, as shown in FIG. 8, the insulation layer 16 is coated on and around the first columnar section 20 and the second columnar section 21 and on upper surfaces of the layers formed on the substrate 1 by, for example, a spin coat method. It is noted that, besides the aforementioned spin coat method, other known technique, such as, a dipping method, a spray coat method, a liquid droplet ejection method (for example, an ink jet method) or the like can be used.

Also, the insulation layer 16 may be patterned by using a wet etching step (a dissolving and removal method). The wet etching step may be a wet developing step of a photolithography technique. In accordance with the present embodiment, the insulation layer 16 having photosensitivity is exposed and developed by using a photolithography technique. Before the wet etching step, the insulation layer 16 may be pre-baked, for example, at about 80-100° C., thereby evaporating the solvent in the insulation layer 16. By so doing, the dissolving rate at the time of wet etching can be made uniform. Also, if a resist layer R4 is provided on the insulation layer 16, as described below, and these layers are to be concurrently exposed and developed, the pre-baking can make the dissolving rate of the insulation layer 16 lower than that of the resist layer R4.

Figure 9:
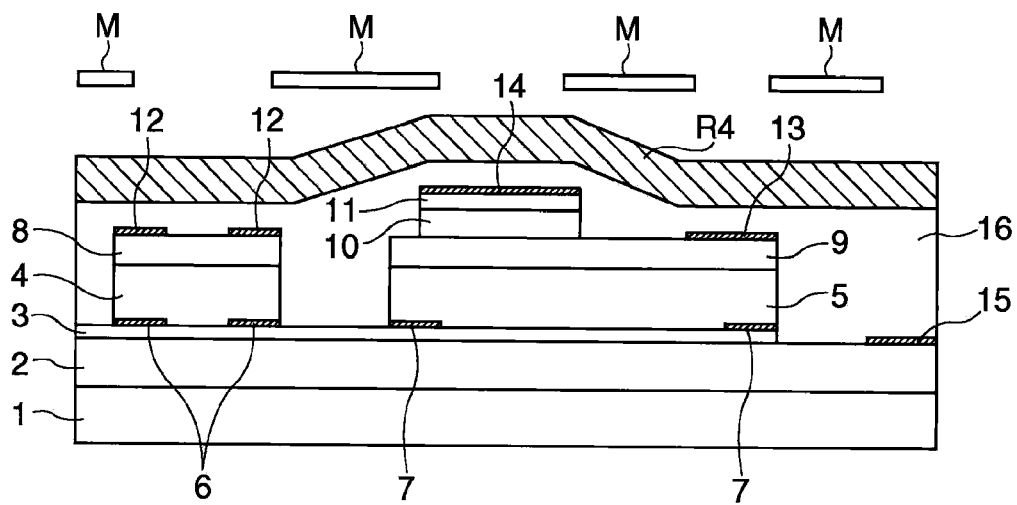
FIG. 9 is a seventh view for describing the method for manufacturing the optical element.
Figure 10:
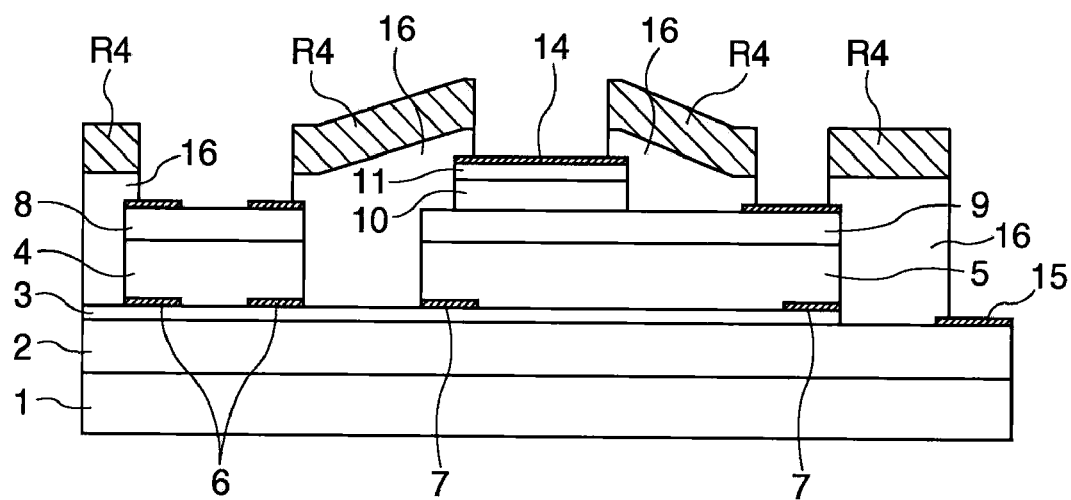
FIG. 10 is an eighth view for describing the method for manufacturing the optical element.
Figure 11:
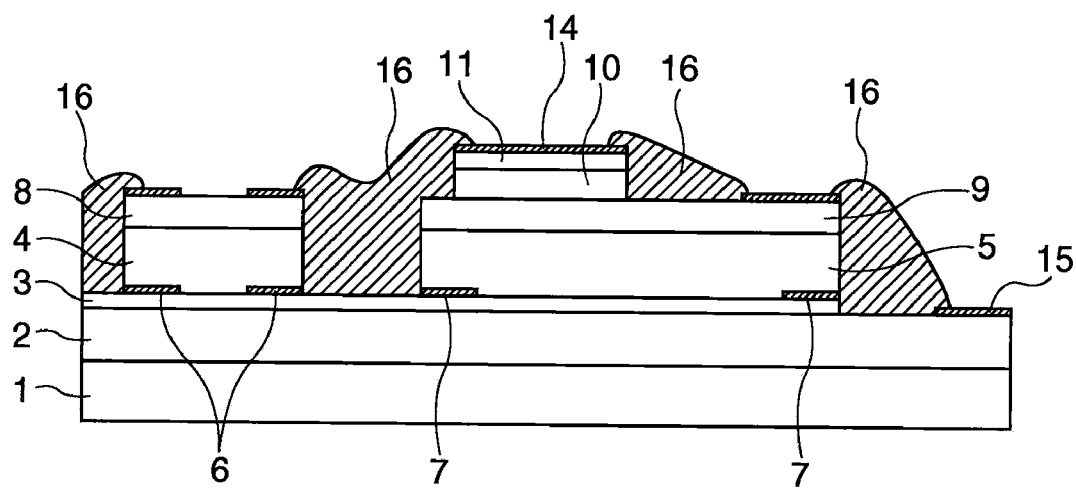
FIG. 11 is a ninth view for describing the method for manufacturing the optical element.

Then, as shown in FIG. 8, a resist layer R4 of photosensitive resist is formed on the insulation layer 16. The resist layer R4 may be composed of positive type resist whose dissolubility at portions irradiated with light energy increases. Then, as shown in FIG. 9, a mask M that opens central areas of the upper surface of the first columnar section 20, the upper surface of the fourth electrode 14, the upper surface of the third electrode 13, and the upper surface of the first electrode 15 is disposed, and light energy is irradiated onto the resist layer R4 through the mask M, thereby exposing and developing the resist layer R4 and the insulation layer 16 together, and patterning the insulation layer 16. This patterning is conducted several times so that an optimum length of exposure and developing time can be secured for each patterning, whereby the patterned configuration can be optimized. As a result, as shown in FIG. 10, central areas of the upper surface of the first columnar section 20, the upper surface of the fourth electrode 14, the upper surface of the third electrode 13, and the upper surface of the first electrode 15 can be exposed, and the resist layer R4 and the insulation layer 16 that cover marginal areas of the aforementioned upper surfaces are formed.

Then, the resist layer R4 is removed. In this instance, resist thinner or the like may be used to dissolve and remove (to wet-etch) the resist layer R4. In this case, by using the difference in dissolving rate between the resist layer R4 and the pre-baked insulation layer 16, the resist layer R4 is entirely removed, and a surface portion of the insulation layer 16 is removed. By so doing, the surface of the insulation layer 16 after the resist layer R4 has been removed can be formed into a smooth curved surface. More specifically, for example, the thickness of the insulation layer 16 gradually reduces from the marginal section of the upper surface of the first columnar section 20 (the second electrode 12) toward the center section thereof, whereby disconnection of a first electrode 17 and a sixth electrode 18 to be described below can be effectively prevented. Then, the insulation layer 16 is hardened by heating at about 350° C.

Then, a fifth electrode 17 and a sixth electrode 18 are formed on the insulation layer 16 thus formed (see FIGS. 1 and 2). Before forming the electrodes, areas where the electrodes are to be formed may be washed with a plasma processing if necessary. Also, as a method for forming the electrodes, for example, at least one layer of conductive material may be formed by a vacuum deposition method, and then, portions of the conductive layer may be removed by a lift-off method. It is noted that a dry etching method may be used instead of the lift-off method.

By the manufacturing method described above, the optical element D composed of the surface-emitting type semiconductor laser V and the rectification diode E shown in FIGS. 1 and 2 can be manufactured. Furthermore, the insulation layer 16 is formed in a manner to cover the marginal portion of the upper surface of the first columnar section 20, in other words, to cover the marginal portion of the second electrode 12, and to cover the marginal portions of the fourth electrode 14 of the second columnar section 21, the first electrode 13 and the first electrode 15, such that disconnection of the fifth electrode 17 and the sixth electrode 18 due to contraction of the insulation layer 16 can be prevented. Furthermore, because the insulation layer 16 covers the upper surface of the second columnar section 21 along the entire circumference thereof, the degree of freedom in designing the optical device D is improved, similarly as described above.

Figure 12:
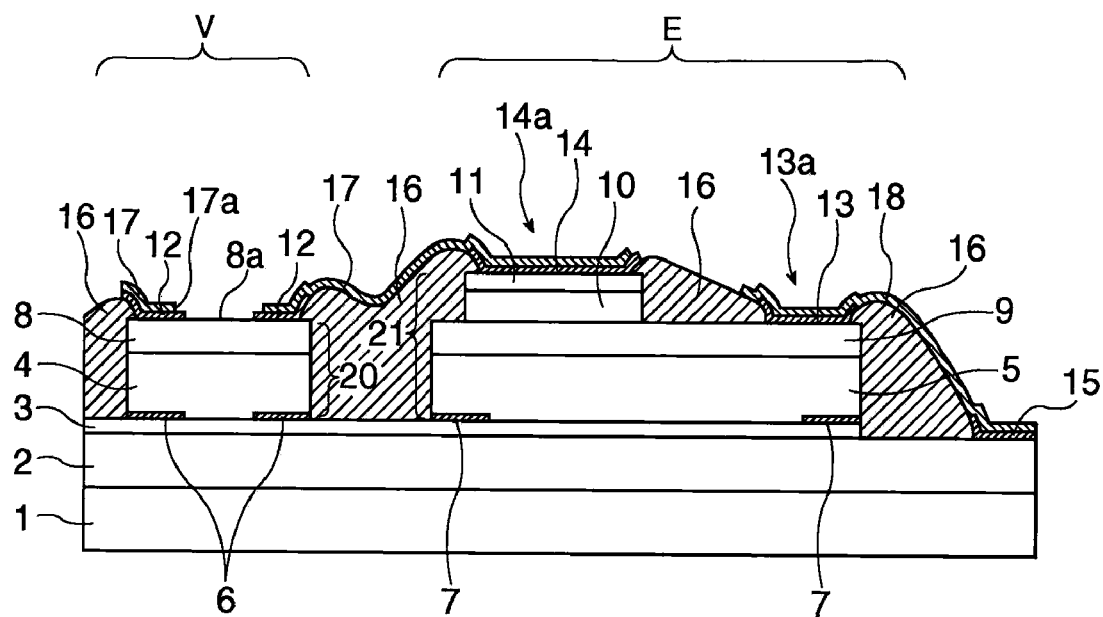
FIG. 12 is a cross-sectional view of an optical element in accordance with another embodiment of the invention.

It is noted that an optical element is not limited to the structure of the embodiment described above, and may have, for example, a structure shown in FIG. 12. FIG. 12 is a schematic cross-sectional view of an optical element in accordance with another embodiment of the invention. In the optical element shown in FIG. 12, marginal portions of a first electrode 15, a second electrode 12, a third electrode 13 and a fourth electrode 14 are formed on an insulation layer 16. Because the marginal portion of the second electrode 12 is formed on the insulation layer 16, a leakage current path is prevented from being formed between the second electrode 12 and a contact layer 8. Further, because the marginal portions of the third electrode 13 and the fourth electrode 14 are formed on the insulation layer 16, leakage current paths can be prevented from being formed between the third electrode 13 and a contact layer 9 and between the fourth electrode 14 and an i-type semiconductor layer 10, like the second electrode 12. With the structure of the present embodiment, loads that may be generated at the time of contraction of the insulation layer 16 are uniformly applied to a second columnar section 21, such that the adhesion between the insulation layer 16 and the second columnar section 21 is maintained and therefore electrostatic destruction of the surface-emitting type semiconductor laser V can be suppressed. Accordingly, the degree of freedom in designing the optical element D is improved.

Figure 13:
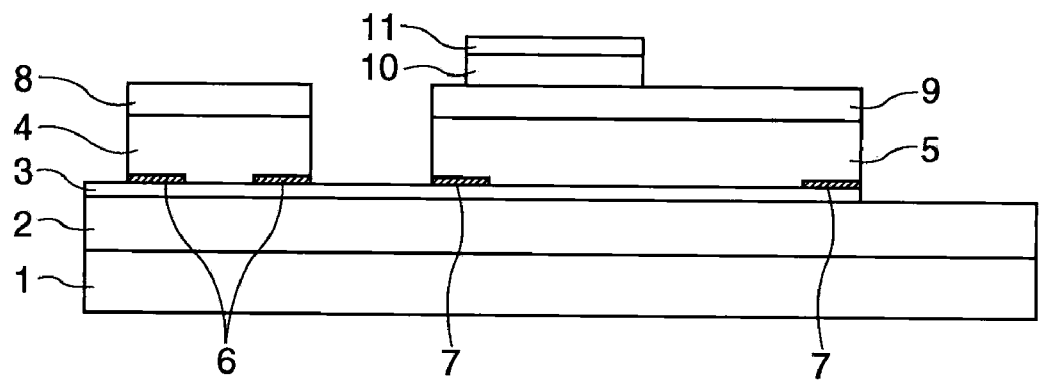
FIG. 13 is a first view for describing a method for manufacturing the optical element shown in FIG. 12.
Figure 14:
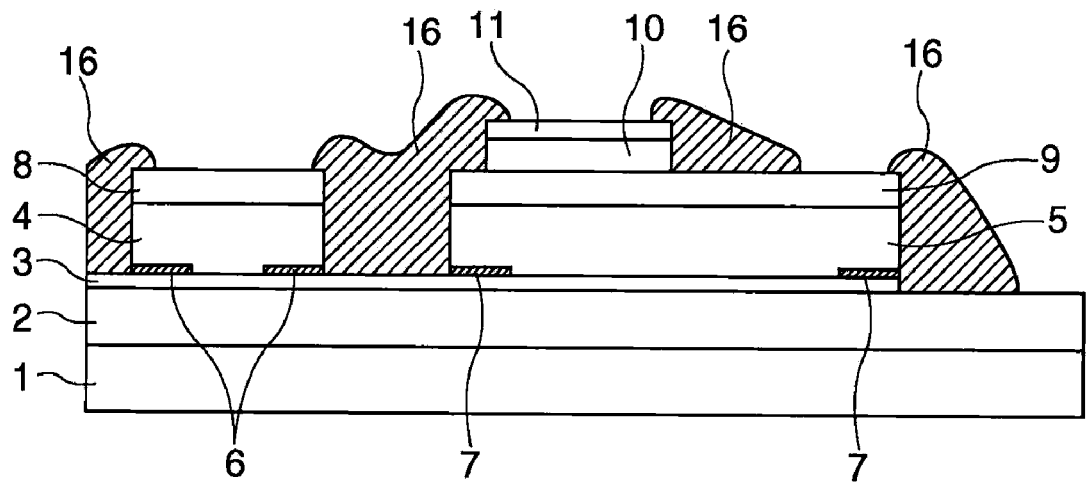
FIG. 14 is a second view for describing the method for manufacturing the optical element.
Figure 15:
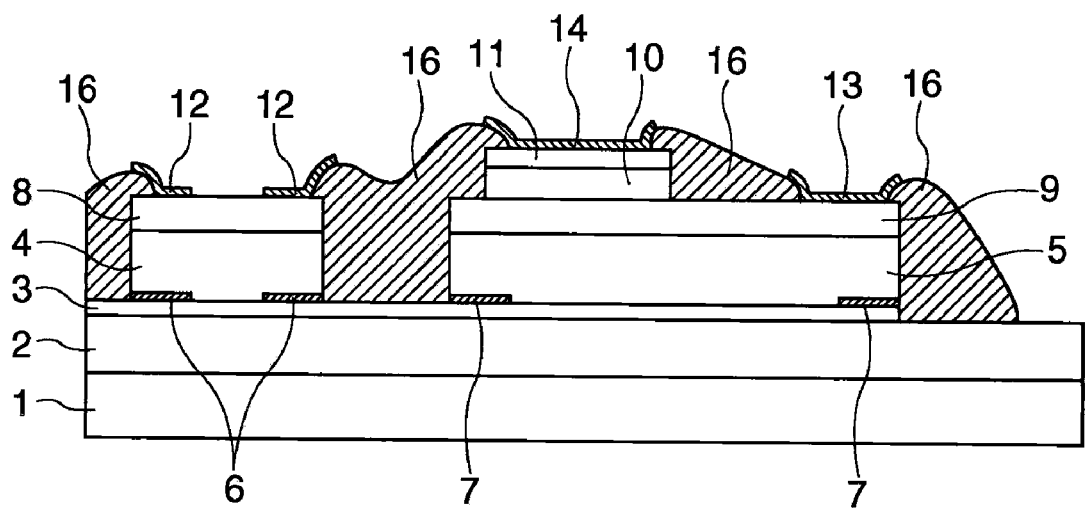
FIG. 15 is a third view for describing the method for manufacturing the optical element.
Figure 16A:
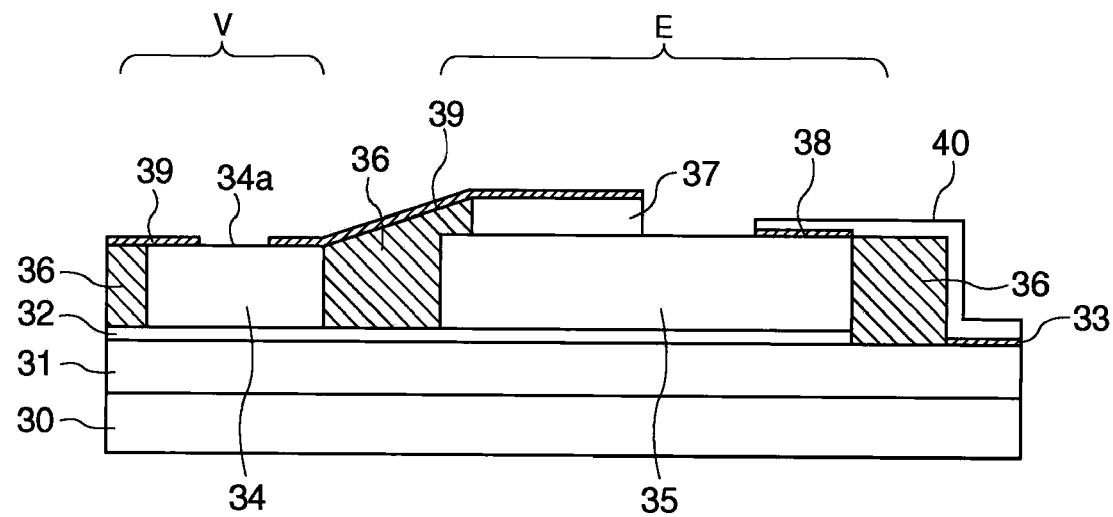
FIG. 16 is a cross-sectional view of a prior art optical element.
Figure 16B:
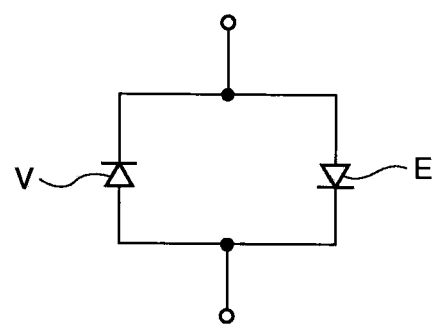

Next, a method for manufacturing the optical element described above is described. FIGS. 13-15 are schematic cross-sectional views of a process for manufacturing the optical element. First, in a manner similar to the embodiment described above, a first mirror layer 2, an active layer 3, a second mirror layer 4, a contact layer 8, an i-type semiconductor layer 10 and an n-type semiconductor layer 11 are formed on a substrate 1, the aforementioned layers are patterned, and then, current constricting layers 6 and 7 are formed, as shown in FIG. 13. Then, as shown in FIG. 14, in a manner similar to the embodiment described above, an insulation layer 16 is formed. Then, as shown in FIG. 15, a first electrode 15, a second electrode 12, a third electrode 13 and a forth electrode 14 each having a predetermined pattern are formed by a photolithography method on the insulation layer 16 thus formed. Further, a fifth electrode 17 and a sixth electrode 18 are formed (see FIG. 12). According to such a manufacturing method, the degree of freedom in designing an optical element is improved, like the embodiment described above.

What is claimed is:

1. An optical element comprising:
   a substrate;
   a surface-emitting type semiconductor laser that is provided on the substrate and emits laser light in a direction orthogonal to a surface of the substrate;
   a rectification element that is provided on the substrate, connected in parallel with the surface-emitting type semiconductor laser, and having a rectification action with respect to a reverse bias voltage applied to the surface-emitting type semiconductor laser, the rectification element including a semiconductor layer disposed on a contact layer, the semiconductor layer having a smaller width than the contact layer such that a top surface of the contact layer is exposed adjacent to the semiconductor layer;
   a first insulation layer that covers a side surface and a portion of an upper surface of a first columnar section including at least a portion of the surface-emitting type semiconductor laser; and
   a second insulation layer that covers a side surface and an upper surface of a second columnar section including at least a portion of the rectification element along an entire circumference thereof, the second columnar section including at least the contact layer and the semiconductor layer with the second insulation layer extending over and covering the exposed top surface of the contact layer adjacent to the semiconductor layer;
   wherein the first insulation layer and the second insulation layer form continuously and fill between the first columnar section and the second columnar section; and
   an electrode extends from the first columnar section to the second columnar section and is disposed on the first insulation layer and the second insulation layer.

2. An optical element according to claim 1, wherein the first insulation layer covers the upper surface of the first columnar section along an entire circumference thereof.

3. An optical element according to claim 1, wherein the electrode is bonded with an upper surface of the first columnar section and is electrically connected to the surface-emitting type semiconductor laser, the first insulation layer covering the upper surface of the first columnar section at least in a portion below the electrode.

4. An optical element according to claim 1, wherein the first insulation layer covers the upper surface of the first columnar section from an outer circumferential end section thereof toward a center thereof by at least 1 μm.

5. An optical element according to claim 1, wherein the electrode is bonded with an upper surface of the second columnar section and is electrically connected to the rectification element, the second insulation layer covering the upper surface of the second columnar section at least in a portion below the electrode.

6. An optical element according to claim 1, wherein the second insulation layer covers the upper surface of the second columnar section from an outer circumferential end section thereof toward a center thereof by at least 1 μm.

7. An optical element comprising:
   a substrate;
   a surface-emitting type semiconductor laser is provided on the substrate, includes a first columnar section and emits laser light in a direction orthogonal to a surface of the substrate;
   a rectification element is disposed on the substrate and includes a second columnar section and a third columnar section, the third columnar section is disposed on the second columnar section, is connected in parallel with the surface-emitting type semiconductor laser, and has a smaller width than the second columnar section, the rectification element having a rectification action with respect to a reverse bias voltage applied to the surface-emitting type semiconductor laser;
   a insulation layer covering a side surface of the first columnar section, at least of a part of an outer edge of an upper surface of the first columnar section, a side surface of the second columnar section, at least of a part of an outer edge of an upper surface of the second columnar section, a side surface of third columnar section, an outer edge of an upper surface of the third columnar section, and fills between a junction of the second columnar section and the third columnar section such that the insulation layer extends over a top surface of the second columnar section;
   a first electrode electrically connected the upper surface of the first columnar section and the upper surface of the third columnar section; and
   a second electrode electrically connected the upper surface of the second columnar section.

* * * * *